United States Patent
Ting et al.

(10) Patent No.: US 8,928,036 B2
(45) Date of Patent: Jan. 6, 2015

(54) HIGH OPERATING TEMPERATURE BARRIER INFRARED DETECTOR WITH TAILORABLE CUTOFF WAVELENGTH

(75) Inventors: David Z. Ting, Arcadia, CA (US); Cory J. Hill, Pasadena, CA (US); Alexander Seibel, South Pasadena, CA (US); Sumith Y. Bandara, Burke, VA (US); Sarath D. Gunapala, Stevenson Ranch, CA (US)

(73) Assignee: California Institute of Technology, Pasadena, CA (US)

( * ) Notice: Subject to any disclaimer, the term of this patent is extended or adjusted under 35 U.S.C. 154(b) by 562 days.

(21) Appl. No.: 12/567,635

(22) Filed: Sep. 25, 2009

(65) Prior Publication Data

US 2010/0072514 A1 Mar. 25, 2010

Related U.S. Application Data

(60) Provisional application No. 61/194,240, filed on Sep. 25, 2008.

(51) Int. Cl.
  *H01L 31/0336* (2006.01)
  *H01L 31/0304* (2006.01)
  *H01L 31/0352* (2006.01)
  *H01L 31/109* (2006.01)
  *H01L 31/18* (2006.01)
  *H01L 21/02* (2006.01)

(52) U.S. Cl.
  CPC ...... *H01L 31/03046* (2013.01); *H01L 31/0304* (2013.01); *H01L 31/0352* (2013.01); *H01L 31/109* (2013.01); *H01L 31/1844* (2013.01); *H01L 21/02398* (2013.01); *H01L 21/02463* (2013.01); *H01L 21/02466* (2013.01); *H01L 21/02546* (2013.01); *H01L 21/02549* (2013.01); *Y02E 10/544* (2013.01)
  USPC ...... 257/184; 257/186; 257/189; 257/E21.09; 257/190; 257/E31.005; 438/94; 438/47

(58) Field of Classification Search
  USPC ............ 257/187, E31.005, 186, 189, E21.09; 438/97, 47
  See application file for complete search history.

(56) References Cited

U.S. PATENT DOCUMENTS

| | | | |
|---|---|---|---|
| 2003/0123504 A1* | 7/2003 | Liu et al. | 372/46 |
| 2004/0119129 A1* | 6/2004 | Giboney | 257/458 |
| 2006/0240670 A1* | 10/2006 | Bugge et al. | 438/689 |
| 2007/0090337 A1* | 4/2007 | Ueno et al. | 257/13 |
| 2007/0215900 A1 | 9/2007 | Maimon | |
| 2007/0235758 A1* | 10/2007 | Klipstein | 257/188 |
| 2008/0111152 A1* | 5/2008 | Scott et al. | 257/188 |

FOREIGN PATENT DOCUMENTS

WO  WO 2008/061141   5/2008

OTHER PUBLICATIONS

Maimon et al., "nBn detector, an infrared detector with reduced dark current and higher operating temperature," App. Phys. Letters 89, 151109, 2006.
Shao et al., "Room-Temperature p-n-p AlGaAsSb—InGaAsSb Heterojunction Phototransistors With Cutoff Wavelength at 2.5 μm," IEEE Ph. Tech. Letters, vol. 18, No. 22, Nov. 15, 2006.
Klipstein, "'XBn' Barrier Photodetectors for High Sensitivity and High Operating Temperature Infrared Sensors," Proc. of SPIE, vol. 6940, 69402U, 2008.
Mikhailova, "Type II heterojunctions in the GaInAsSb/GaSb system," Semicond. Sci. Technol., 9, 1994, 1279-1295, UK.

* cited by examiner

*Primary Examiner* — Ori Nadav
(74) *Attorney, Agent, or Firm* — Canady & Lortz LLP; Bradley K. Lortz

(57) ABSTRACT

A barrier infrared detector with absorber materials having selectable cutoff wavelengths and its method of manufacture is described. A GaInAsSb absorber layer may be grown on a GaSb substrate layer formed by mixing GaSb and InAsSb by an absorber mixing ratio. A GaAlAsSb barrier layer may then be grown on the barrier layer formed by mixing GaSb and AlSbAs by a barrier mixing ratio. The absorber mixing ratio may be selected to adjust a band gap of the absorber layer and thereby determine a cutoff wavelength for the barrier infrared detector. The absorber mixing ratio may vary along an absorber layer growth direction. Various contact layer architectures may be used. In addition, a top contact layer may be isolated into an array of elements electrically isolated as individual functional detectors that may be used in a detector array, imaging array, or focal plane array.

29 Claims, 9 Drawing Sheets

HIGH OPERATING TEMPERATURE BARRIER INFRARED DETECTOR WITH TAILORABLE CUTOFF WAVELENGTH

CROSS-REFERENCE TO RELATED APPLICATIONS

This application claims the benefit under 35 U.S.C. §119 (e) of the following U.S. provisional patent application, which is incorporated by reference herein:

U.S. Provisional Patent Application No. 61/194,240, filed Sep. 25, 2008, and entitled "HIGH OPERATING TEMPERATURE BARRIER INFRARED DETECTOR (HOT-BIRD) WITH TAILORABLE CUTOFF WAVELENGTH", by Ting et al.

STATEMENT OF GOVERNMENT RIGHTS

The invention described herein was made in the performance of work under a NASA contract, and is subject to the provisions of Public Law 96-517 (35 USC 202) in which the Contractor has elected to retain title.

BACKGROUND OF THE INVENTION

1. Field of the Invention

This invention relates to barrier photodetectors. Particularly, this invention relates to high operating temperature barrier infrared detectors.

2. Description of the Related Art

Photodectors are electro optical devices that respond to incident light. They have a wide range of applications, including imaging. One class of photodectors operates in the infrared light range. Such devices have applications in infrared imaging including planetary exploration, industrial quality control, monitoring pollution, firefighting, law enforcement, and medical diagnosis.

In conventional semiconductor p-n junction photodetectors, the depletion layer at the junction impedes the flow of the majority carriers across the junction, while allowing the minority carriers to flow freely. Although the depletion layer enhances detector performance in this manner, it also introduces Shockley-Read-Hall (SRH) dark currents which introduce noise. The resulting dark current limits the operating temperature. However in recent years, a newly developed class of infrared photodectors has been employing an embedded barrier layer to suppress SRH currents, as well as surface leakage currents.

The barrier infrared photodetector concept is described in U.S. Patent Application Publication No. 2007/0215900, published Sep. 20, 2007, by Maimon, which is incorporated by reference herein and discloses a photo-detector comprising a photo absorbing layer comprising an n-doped semiconductor exhibiting a valence band energy level, a barrier layer, a first side of the barrier layer adjacent a first side of the photo absorbing layer, the barrier layer exhibiting a valence band energy level substantially equal to the valence band energy level of the doped semiconductor of the photo absorbing layer, and a contact area comprising a doped semiconductor, the contact area being adjacent a second side of the barrier layer opposing the first side, the barrier layer exhibiting a thickness and a conductance band gap sufficient to prevent tunneling of majority carriers from the photo absorbing layer to the contact area and block the flow of thermalized majority carriers from the photo absorbing layer to the contact area. Alternatively, a p-doped semiconductor may be utilized, and conductance band energy levels of the barrier and photo absorbing layers are equalized.

Further discussion of the operation of a barrier infrared photodetector may be found in Klipstein, "'XBn' Barrier Photodetectors for High Sensitivity and High Operating Temperature Infrared Sensors," Infrared Technology and Applications XXXIV, Proc. of SPIE Vol. 6940, 69402U, 2008, which is incorporated by reference herein. The article describes a barrier photodetector is a device in which the light is absorbed in a narrow bandgap semiconductor layer whose bands remain essentially flat or accumulated at the operating bias so that all carrier depletion is excluded. In a conventional photodiode below a threshold temperature, typically 130-150K for mid-wave infrared (MWIR) devices, the dark current is due to Generation-Recombination (G-R) centers in the depletion layer. In a barrier detector, the absence of depletion in the narrow bandgap semiconductor ensures that the G-R contribution to the dark current is negligible. The dark current in the barrier detector is thus dominated by the diffusion component, both above and below the threshold temperature. Therefore, at a given temperature below the threshold temperature, a barrier detector will exhibit a lower dark current than a conventional photodiode with the same cut-off wavelength. Alternatively, for a given dark current, a barrier detector will operate at a higher temperature than a conventional photodiode, provided that this temperature is below the threshold temperature. Some device architectures are presented for barrier detectors with photon absorbing layers based on $InAs_{1-x}Sb_x$ alloys and type-II InAs/GaSb superlattices (T2SL). The thermionic and tunneling components of the dark current are analyzed and shown to be negligible for typical device parameters. An operating temperature of ~150K may be estimated for a MWIR barrier detector with f/3 optics and a cut-off wavelength of 4.2 microns.

In addition, International Patent Application Publication No. WO 2008/061141 by Caine et al., published May 2008 and incorporated by reference herein, describes a method of making a two-dimensional detector array (and of such an array) comprising, for each of a plurality of rows and a plurality of columns of individual detectors, forming an n-doped semiconductor photo absorbing layer, forming a barrier layer comprising one or more of AlSb, AlAsSb, AlGaAsSb, AlPSb, AlGaPSb, and HgZnTe, and forming an n-doped semiconductor contact area.

However, specific designs of barrier photodetectors with high performance can be difficult to develop. The combination of barrier layer and absorber much be carefully selected to yield optimal results. Building an nBn or XBn infrared detector requires a matching pair of absorber and barrier materials with the following properties: (1) their valence band edges ($E_v$) must be approximately the same to allow unimpeded hole flow, while their conduction band edges ($E_c$) should have a large difference to form an electron barrier, (2) they must have substantially similar lattice constants, and (3) their lattice constants should also match closely to that of a readily available semiconductor substrate material that they are grown on in order to ensure high material quality and low defect density.

The lattice-matching to substrate requirement is particularly important for the absorber material, because of the need to grow a thick absorber layer, typically a few microns, for high absorption quantum efficiency. The barrier is typically only a few hundred nanometers thick, and therefore can tolerate a small amount of lattice-mismatching to the substrate material without suffering degradation in the barrier material quality. Because of this set of stringent requirements, initially the nBn detector was implemented with success only in a single material system, using an InAsSb infrared absorber that is lattice-matched to GaSb substrate, and an AlSbAs barrier with a matching valence band edge. The approximate composition of the lattice-matched InAsSb ternary alloy is $InAs_{0.91}Sb_{0.09}$. The limitation of this implementation is that the absorbers material, and hence the infrared detector made from it, has a fixed cutoff wavelength, at approximately 4.2 μm when measured at 200K.

Particular applications may require an infrared detector having a specific cutoff wavelength. Typically, an infrared detector with a shorter cutoff wavelength can operate at higher temperature or with reduced dark current (noise). If a particular application requires, for examples, infrared detection with 3 μm cutoff wavelength, then even though the 4.2 μm nBn detector could be used, an nBn detector with a 3 μm cutoff wavelength would be more suitable because it could operate at the same temperature with higher sensitivity, or alternatively, at a higher temperature with the same sensitivity. It is almost always desirable to have barrier photodectors that operate at higher temperatures to reduce or eliminate cooling requirements.

In view of the foregoing, there is a need in the art for apparatuses and methods for improved barrier infrared detectors that operate with short- to mid-wavelength infrared light, e.g. approximately 1 to 5 μm. There is particularly a need for such apparatuses and methods to operate at high operating temperatures, e.g. well above approximately 77K. There is further a need for such apparatuses and methods to operate having a tailorable cutoff wavelength. These and other needs are met by embodiments of the present invention as detailed hereafter.

SUMMARY OF THE INVENTION

A barrier infrared detector with absorber materials having selectable cutoff wavelengths and its method of manufacture is described. A GaInAsSb absorber layer may be grown on a GaSb substrate layer formed by mixing GaSb and InAsSb by an absorber mixing ratio. A GaAlAsSb barrier layer may then be grown on the barrier layer formed by mixing GaSb and AlSbAs by a barrier mixing ratio. The absorber mixing ratio may be selected to adjust a band gap of the absorber layer and thereby determine a cutoff wavelength for the barrier infrared detector. The absorber mixing ratio may vary along an absorber layer growth direction. Various contact layer architectures may be used. In addition, a top contact layer may be isolated into an array of elements electrically isolated as individual functional detectors that may be used in a detector array, imaging array, or focal plane array.

A typical embodiment of the invention comprises a barrier infrared detector, including a substrate layer comprising substrate GaSb, an absorber layer substantially lattice matched to the substrate layer and comprising GaInAsSb formed by mixing absorber GaSb and InAsSb by an absorber mixing ratio between the InAsSb and the absorber GaSb, and a barrier layer disposed on the absorber layer and comprising GaAlAsSb formed by mixing barrier GaSb and AlSbAs by a barrier mixing ratio between the AlSbAs and the barrier GaSb. The absorber layer and the barrier layer have substantially similar valence band edges to allow unimpeded hole flow and a large difference between their conduction band edges to form an electron barrier. In some embodiments of the invention, the absorber mixing ratio may vary along an absorber layer growth direction. Typically, the InAsSb mixed into the absorber layer may comprise $InAs_{0.91}Sb_{0.09}$ and the AlSbAs mixed into the barrier layer may comprise $AlSb_{0.92}As_{0.08}$.

In further embodiments, the barrier layer is also substantially lattice matched to the absorber layer and the substrate layer. The absorber mixing ratio may be selected to adjust a band gap of the absorber layer and thereby determines a cutoff wavelength for the barrier infrared detector device and the barrier mixing ratio may be selected such that valence band edges of the barrier layer and the absorber layer match.

In some embodiments of the invention, a bottom contact layer may be disposed between the substrate layer and the absorber layer and a metal contact deposited on an exposed bottom contact area. Alternately, a metal contact may be deposited on an exposed absorber area of the absorber layer in other embodiments of the invention (i.e. without employing a bottom contact layer).

In other embodiments of the invention, a top contact layer may be disposed on the barrier layer. Typically, the top contact layer may be n-doped. However, the top contact layer may comprise doping differing from that of the absorber layer.

In further embodiments, the top contact layer may comprise top contact GaInAsSb formed by mixing top contact GaSb and top contact InAsSb by a top contact mixing ratio. In this case, the top contact mixing ratio may differ from the absorber mixing ratio and the barrier mixing ratio may vary along a barrier layer growth direction.

In additional embodiments, the top contact layer may be isolated into an array of elements. A separate metal contact may be deposited on each element of the array of the top contact layer. The array of elements forms substantially electrically isolated individual functional detectors that may be used in a detector array, imaging array, or focal plane array.

In a similar manner, a typical method of producing a barrier infrared detector, comprises providing a substrate layer comprising substrate GaSb, growing an absorber layer disposed on the substrate layer and comprising GaInAsSb formed by mixing absorber GaSb and InAsSb by an absorber mixing ratio between the InAsSb and the absorber GaSb, and growing a barrier layer disposed on the absorber layer and comprising GaAlAsSb formed by mixing barrier GaSb and AlSbAs by a barrier mixing ratio between the AlSbAs and the barrier GaSb. The absorber layer and the substrate layer have a substantially matching lattice constant. The method may be further modified consistent with the apparatus embodiments described herein.

BRIEF DESCRIPTION OF THE DRAWINGS

Referring now to the drawings in which like reference numbers represent corresponding parts throughout.

DETAILED DESCRIPTION OF THE PREFERRED EMBODIMENT

1. Overview

A novel mid-wavelength infrared (MWIR) barrier infrared detector based on the nBn device structure has demonstrated breakthrough performance. This nBn detector is a high operating temperature barrier infrared detector (HOT-BIRD) capable of operating at higher temperature than the prior art MWIR detectors based on InSb and HgCdTe (MCT). Particularly, an example nBn has been produced with an $InAs_{0.91}Sb_{0.09}$ infrared absorber, which is lattice-matched to the GaSb substrate, and a AlSbAs barrier, which is substantially lattice-matched to the GaSb substrate. The detector has yielded a fixed cutoff wavelength of 4.2 μm at a temperature of 200K. At the time, this was the only material system in which the HOT-BIRD has demonstrated a decisive advantage.

In order to increase the versatility and utility of the HOT-BIRD, it is preferable to have the ability to implement the barrier infrared detector with absorber materials having selectable cutoff wavelengths. One clear advantage for doing so is to raise the operating temperature. For example, while the 4.2 μm cutoff wavelength HOT-BIRD can function for an application that requires infrared detectors with a 3 μm cutoff wavelength, a tailor-made 3 μm wavelength cutoff barrier infrared detector would be preferable because it could operate with the same sensitivity but at a higher temperature.

Embodiments of the present invention can be implemented with the quaternary alloy GaInAsSb as the absorber layer, GaAlSbAs as the barrier layer, on lattice matching GaSb substrate layer. The cutoff wavelength of the GaInAsSb absorber layer can be tailored by adjusting the alloy composition. It should be noted that throughout the specification, a quaternary alloy formed by mixing GaSb and a ternary alloy by a mixing ratio is denoted as (ternary alloy) y (GaSb)(1-y), where y is the mixing ratio and indicates a resulting composition from known semiconductor material growth techniques as will be understood by those skilled in the art. In addition, GaSb is employed to form many of the semiconductor layers as described throughout the specification. Accordingly, GaSb employed in a particular layer may be identified with reference to the particular layer, e.g. absorber GaSb.

Thus, GaInAsSb formed by mixing absorber GaSb and InAsSb by an absorber mixing ratio between the InAsSb and the absorber GaSb means GaInAsSb formed by (InAsSb) z (GaSb)(1-z) where z is the absorber mixing ratio. Similarly, GaAlAsSb formed by mixing barrier GaSb and AlSbAs by a barrier mixing ratio between the AlSbAs and the barrier GaSb means GaAlAsSb formed by (AlSbAs) y (GaSb)(1-y), where y is the barrier mixing ratio.

2. Barrier Infrared Detector Operating Principle

Figure 1A:
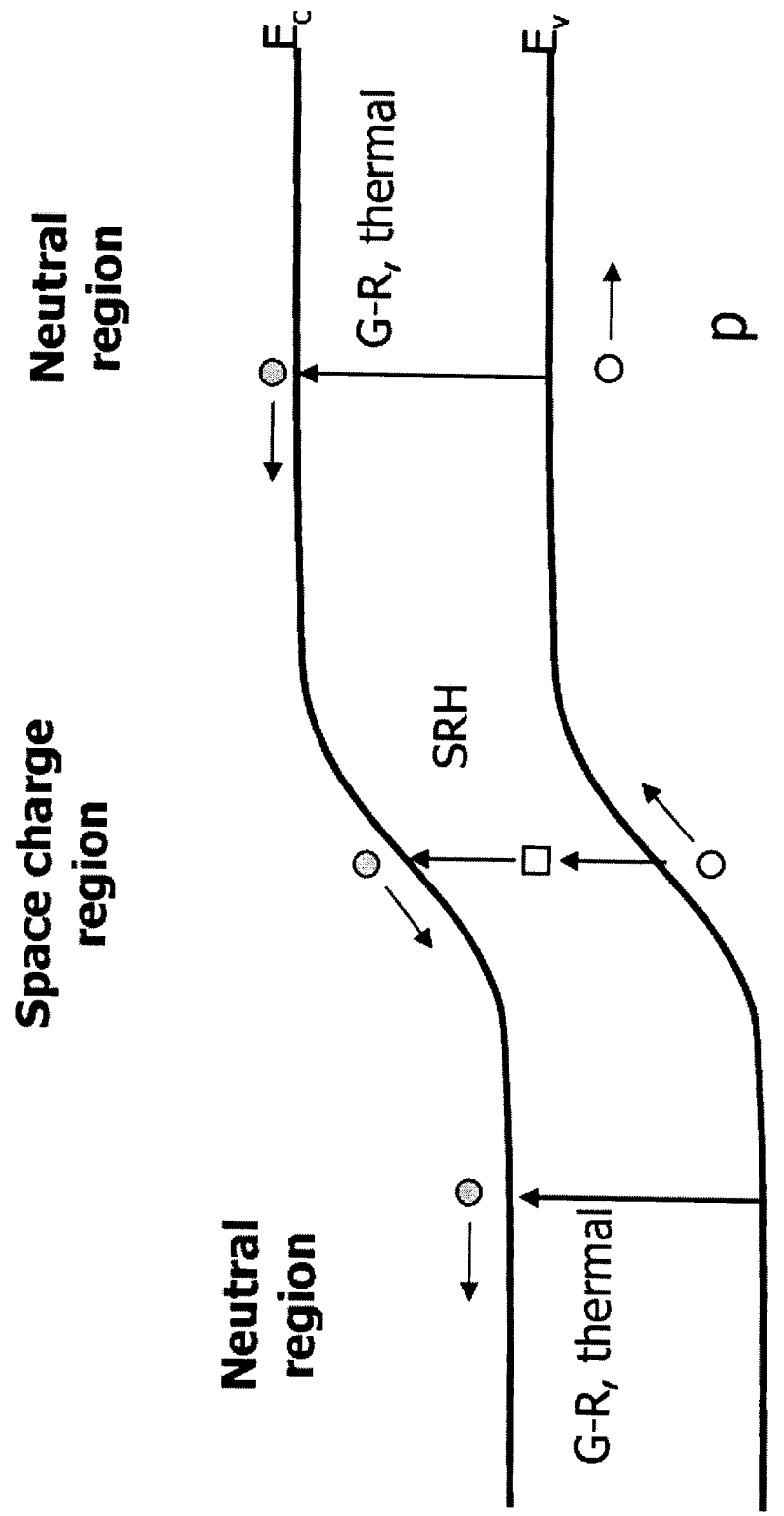
FIGS. 1A and 1B are schematic energy band diagrams showing exemplary conduction and valence band edges of a p-n photodiode and an nBn photodetector, respectively.
Figure 1B:
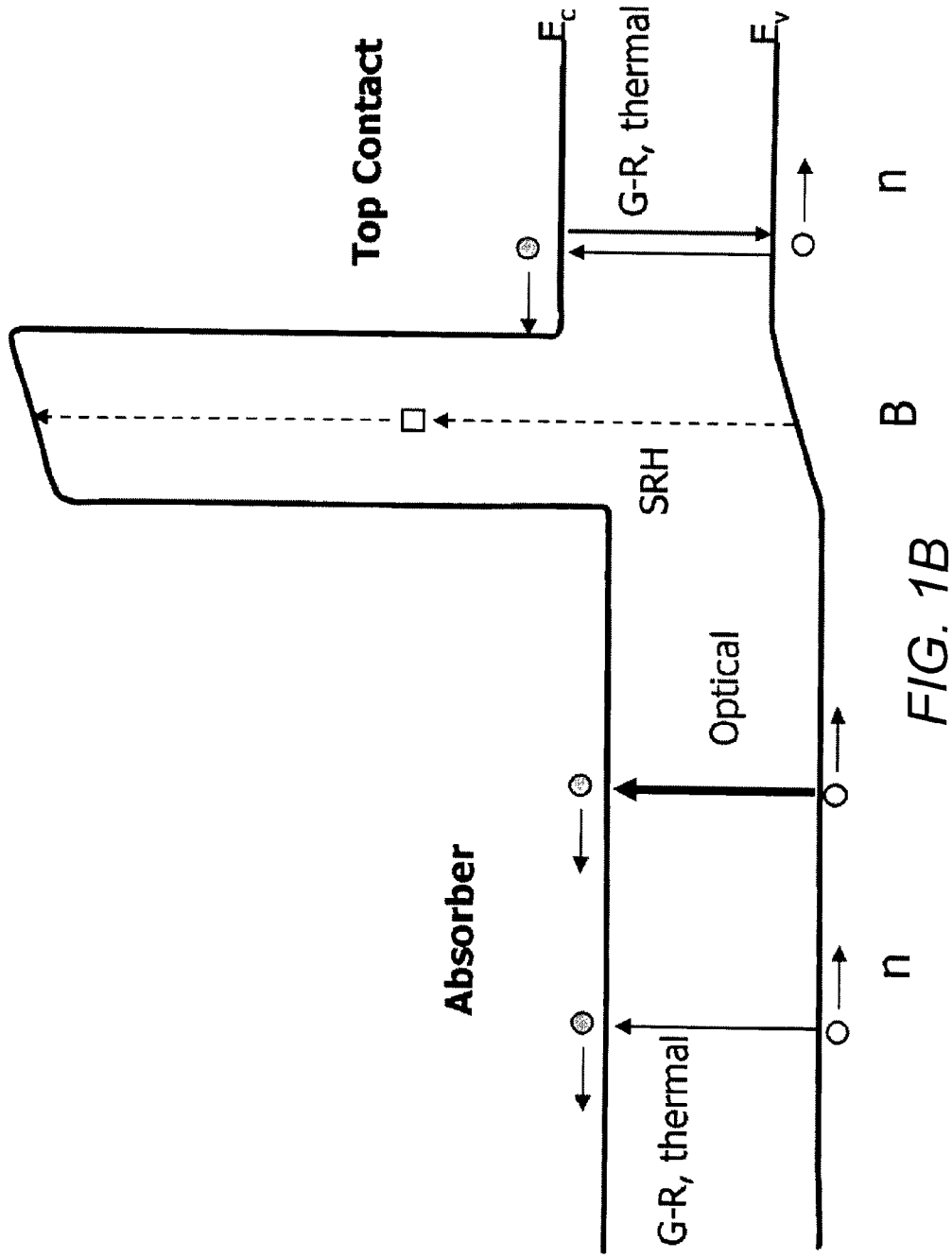

FIGS. 1A and 1B are schematic energy band diagrams showing exemplary conduction and valence band edges of a p-n photodiode and an nBn barrier infrared detector, respectively. The energy band diagram of a typical barrier photodetector structure shown in FIG. 1B has a lightly n-doped IR absorber layer region, a barrier layer, and an n-doped top contact layer. It resembles the energy band diagram of a typical conventional p-n photodiode shown in FIG. 1A, except that the n-type absorber layer region is now doped lightly n-type, the junction (space charge region) is replaced by a specially designed wide-gap barrier layer (B), and that the p-contact layer is replaced by an n-contact layer. The unique characteristics of the barrier infrared detectors result from heterostructures that contain specially designed barrier layers which can block one type of carrier (either electrons or holes) but at the same time allow the unimpeded flow of the other type of carrier. It is important to note is that the barrier layer does not block the flow of photo-generated electrons or holes in the absorber layer. FIG. 1B shows that photo-generated electrons and holes in the absorber layer can flow to the left and the right, respectively; neither is blocked by the barrier layer. However, the barrier layer is highly effective at blocking dark current. Reducing dark current (noise) without impeding photocurrent (signal) is the key to the success of the barrier infrared detector design.

Dark current reduction is an important objective in order to achieve high-performance in infrared detectors. Reducing dark current (noise) increases D* (specific detectivity; a measure of signal-to-noise ratio), and leads to higher detector operating temperature and/or sensitivity. Modern high-performance infrared detectors are typically based on the p-n junction design, as illustrated above in FIG. 1A. In a p-n diode, the major performance-limiting dark current mechanisms are: (1) surface leakage current, (2) diffusion dark current, and, (3) generation-recombination (G-R) dark current. Surface leakage currents could typically be suppressed by passivation and/or planar process techniques. The diffusion dark current comes mainly from thermally generated minority carriers from quasi-neutral regions outside the junctions, and is proportional to $exp(-E_g/kT)$, where $E_g$ is the energy band gap of the detector absorber material. G-R dark currents come from band-to-band radiative, Auger (carrier scattering), and Shockley-Read-Hall (SRH) processes. While radiative and Auger processes are fundamental, occurring even in the absorber region, the SRH process, which occurs in the depletion regions surrounding the junction, is due to crystal defects and impurity energy levels within the energy band gap. The SRH dark current is proportional to $exp(-E_g/2kT)$, and is often the dominant dark current source, particularly at lower temperatures. Therefore, it is highly desirable to eliminate SRH dark current, either by reducing surface and bulk defects or through device design. Dark current performance is then governed by the more fundamental mechanisms.

An important infrared detector design element for dark current reduction is the use of semiconductor heterostructures. In this regard, the barrier infrared detector approach has proven to be highly effective. In a p-n junction, as illustrated in FIG. 1A, dropping bias over the junction (space charge region) inevitably creates unwanted G-R dark current due to SRH processes. Under typical operating conditions, nBn structure is biased slightly for hole collection at the top contact layer, as illustrated in FIG. 1B. Most of the applied bias drops over the barrier region, for which the SRH dark current is almost totally suppressed because of the much wider band gap (recall SRH dark current is proportional to $\exp(-E_g/2kT)$, and is suppressed when $E_g$ is large). The barrier also serves to block the flow of electrons (the majority carrier) dark current from the top contact layer; the electrons blocked by the barrier layer eventually recombine with the thermally generated holes so that there is no net diffusion dark current from the contact layer. This mechanism is very significant for dark current suppression at higher temperatures, where diffusion dark current becomes important. In addition, when used in conjunction with a planar manufacturing process, the wide band gap barrier prevents surface recombination and serves to suppress surface leakage current.

Dark current suppression results in increased signal-to-noise ratio at a given temperature, or, alternatively, higher operating temperature with the same S/N ratio in a barrier infrared detector. As a result of these dark current reduction mechanisms, a barrier infrared detector can exhibit breakthrough performance.

3. Exemplary Barrier Infrared Detector with Tailorable Cutoff Wavelength

Figure 2A:
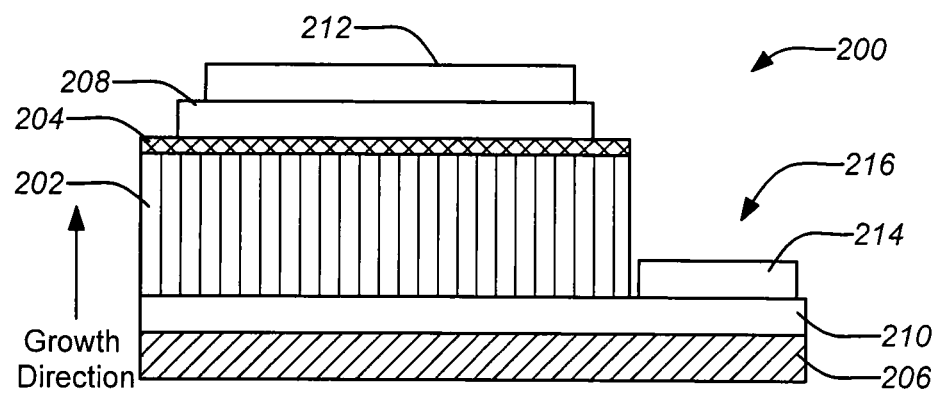
FIG. 2A illustrates an exemplary barrier infrared detector embodiment with a bottom contact layer disposed between the substrate layer and the absorber layer and a metal contact deposited on an exposed bottom contact area.

FIG. 2A illustrates an exemplary barrier infrared detector embodiment with a bottom contact layer disposed between the substrate layer and the absorber layer and a metal contact deposited on an exposed bottom contact area. The device 200 shows an nBn structure comprising an infrared absorber layer 202 and an adjacent barrier layer 204 inserted in the device to suppress dark current. As detailed hereafter, the absorber layer 202 comprises GaInAsSb formed by mixing absorber GaSb and InAsSb by an absorber mixing ratio between the InAsSb and the absorber GaSb, e.g. $(InAs_{0.91}Sb_{0.09}) z (GaSb) (1-z)$ where z is the absorber mixing ratio. The absorber mixing ratio is selected to determine the cutoff wavelength for the device 200. The barrier layer 204 comprises GaAlAsSb formed by mixing barrier GaSb and AlSbAs by a barrier mixing ratio between the AlSbAs and the barrier GaSb, e.g. $(AlSb_{0.92}As_{0.08}) y (GaSb)(1-y)$ where y is the barrier mixing ratio. The barrier mixing ratio is selected such that valence band edges of the barrier layer 204 and the absorber layer 202 match. Both the absorber layer 202 and the barrier layer 204 may be grown in series on a GaSb substrate layer 206 to which they are both lattice matched. Typically, the absorber layer 202 may be a few microns (e.g., approximately 5 to 6 microns) in thickness, while the barrier layer 204 is much thinner. Typically, the barrier layer 204 may be only a few hundred nanometers thick, e.g. 200 nm. In some embodiments, the absorber mixing ratio and/or the barrier mixing ratio may be varied along the growth direction of the layers (indicated by the arrow in the figure) as will be described hereafter with reference to FIGS. 3A to 3C. Typically, the top contact layer may be n-doped. However, the top contact layer may comprise doping differing from that of the absorber layer.

In the exemplary device 200, the absorber layer 202 and barrier layer 204 are bounded electrically by a bottom contact layer 210 and a top contact layer 208. The top and bottom contact layers 208, 210 provide suitable areas for deposition of top and bottom metal contacts 212, 214 for electrical connection of the device 200. The top contact layer 208 may be grown on the barrier layer 204 with the top metal contact 212 deposited thereon. The bottom contact layer 210 may be grown on the substrate layer 206 (to be disposed between the substrate layer 206 and the absorber layer 202 after the absorber layer 202 is grown on it). A bottom metal contact 214 may then be deposited on an exposed bottom contact area 216. The bottom contact area 216 may be exposed by etching as will be understood by those skilled in the art. It should be noted that embodiments of the invention may employ any alternate contact layer and metal contact designs. In some embodiments, the top contact layer may comprise top contact GaInAsSb formed by mixing top contact GaSb and top contact InAsSb by a top contact mixing ratio. This top contact mixing ratio may differ from the absorber mixing ratio in some embodiments as described hereafter with reference to FIG. 3C.

Figure 2B:
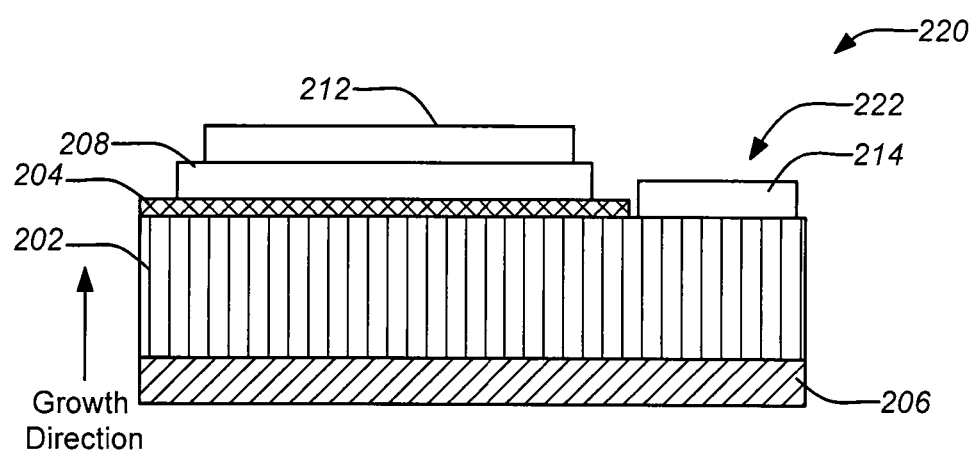
FIG. 2B illustrates an exemplary barrier infrared detector embodiment with a metal contact deposited on an exposed absorber area of the absorber layer.

FIG. 2B illustrates an exemplary barrier infrared detector device 220 with a metal contact deposited on an exposed absorber area of the absorber layer. In general the device 220 functions in the same manner and with the same elements as the device 200 described in FIG. 2A. However, in this case, the bottom contact layer 210 is eliminated and a bottom metal contact 214 is deposited directly on an exposed absorber area 222 of the absorber layer 202 of the device 220. Electrical connection to the absorber layer 202 is provided through this alternate technique.

Figure 2C:
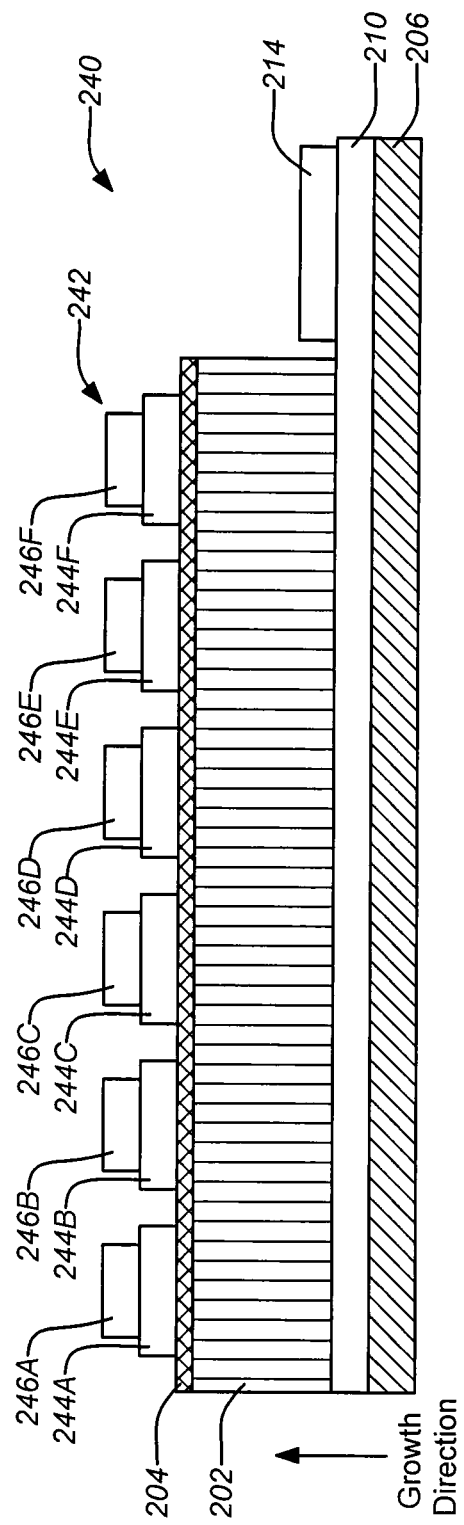
FIG. 2C illustrates an exemplary barrier infrared detector embodiment of the invention comprising an array of elements.

FIG. 2C illustrates an exemplary barrier infrared detector device 240 comprising an array of elements. In general the device 220 functions in the same manner and with the same elements as the device 200 described in FIG. 2A. In this case, however, the top contact layer 208 is isolated into an array 242 of elements 244A-244F. Isolation of the array may be achieved by etching the grown top contact layer or by any other known technique. Separate metal contacts 246A-246F may then be deposited on each element 244A-244F of the array 242 of the top contact layer. The array 242 of elements 244A-244F forms electrically isolated individual functional detectors between their separate metal contacts 246A-246F and the common bottom metal contact 214 that may be used in a detector array, imaging array, or focal plane array as will be understood by those skilled in the art. It should be noted that the array device 240 is shown having a bottom metal contact 214 design of the device 200 of FIG. 2A, however, bottom contact layer 210 and bottom metal contact 214 design of the device 220 of FIG. 2B may also be employed with the array device 204 as will be appreciated by those skilled in the art.

The example detectors 200, 220, 240 may be further enhanced through additional and/or alternate components and architectures consistent with the described parameters and any known techniques of semiconductor device manufacture, and particularly known photodetector semiconductor devices including known barrier infrared detectors, as will be understood by those skilled in the art. In a similar manner, embodiments of the invention may employ any known materials and architectures for the various layers, e.g. contact layers, typical of any other known barrier infrared detectors as will be understood by those skilled in the art.

Figure 3A:
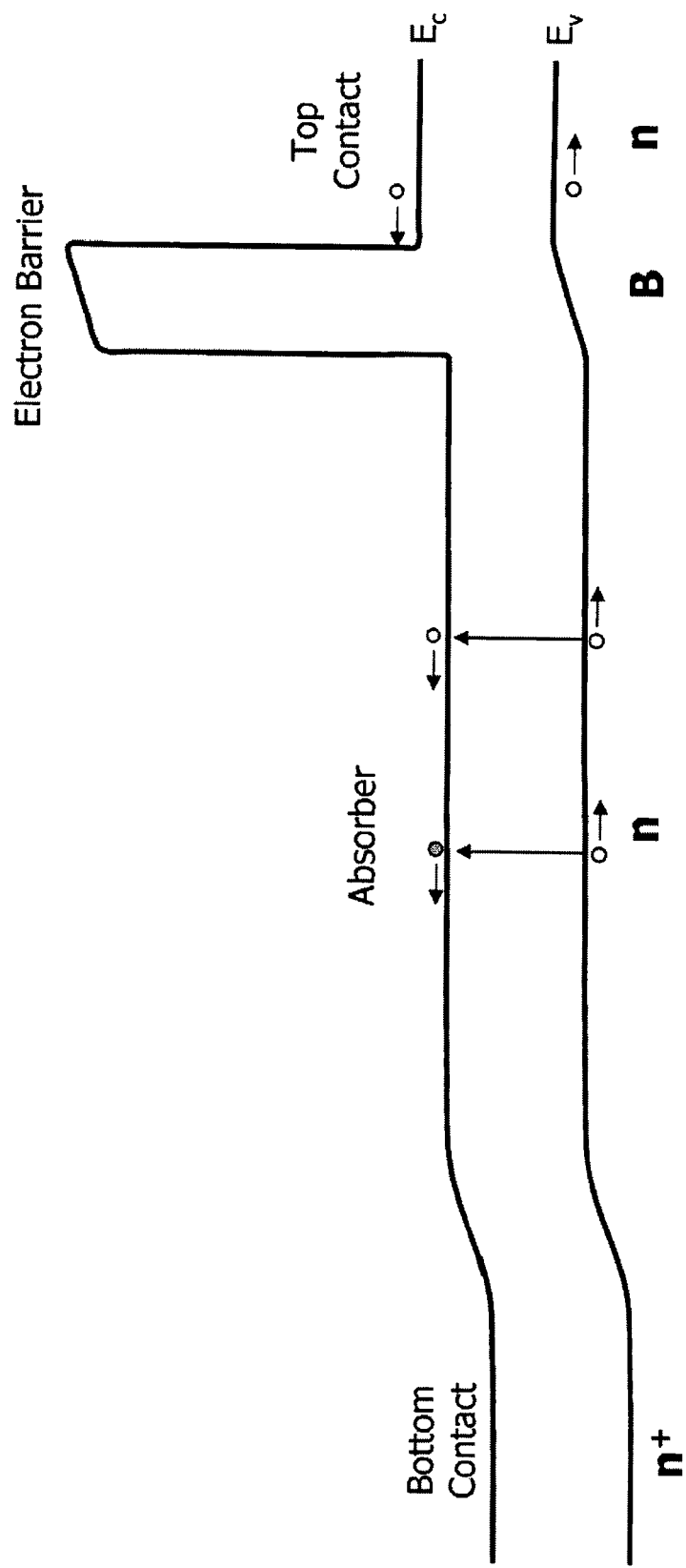
FIG. 3A is a schematic energy band diagram showing exemplary conduction and valence band edges for an exemplary barrier infrared detector.

FIG. 3A is a schematic energy band diagram showing exemplary conduction and valence band edges for the exemplary barrier infrared detector. This is similar to the more generalized energy band diagram of FIG. 1B. The energy bands are shown across the bottom contact layer, followed by a lightly n-doped IR absorber layer, a barrier layer, and an n-doped top contact layer. The barrier layer is carefully designed to suppress dark currents (noise) without impeding the flow of electron or hole photocurrent (signal). Note that the substrate layer 206 of the device 200 is typically not identified as an element of the energy band diagram as known in the art. The substrate layer 206 is essentially irrelevant to the infrared detection operation of the device.

A exemplary high operating temperature barrier infrared detector embodiment of the invention (e.g. as illustrated in FIG. 3A) employs a matching pair of absorber layer and barrier layer materials having valence band edges (Ev) being approximately the same to allow unimpeded hole flow, while conduction band edges (Ec) exhibit a large difference to form an electron barrier. In addition, the absorber layer and barrier layer materials should have a substantially similar lattice constant, which should also match the lattice constant of the substrate layer material they are grown on to ensure high material quality and low defect density. It is remarkable to identify an $InAs_{0.91}Sb_{0.09}$ MWIR absorber layer with a matching $AlSb_{0.92}As_{0.08}$ electron barrier layer, both of which can be grown on the readily available GaSb substrate, in order to produce the 4.2 micron cutoff wavelength HOT-BIRD. Thus, producing a HOT-BIRD with additional benefit of having a tailorable cutoff wavelength is not a simple task.

In order to produce such a HOT-BIRD (e.g. as illustrated in FIG. 3A) with a tailorable cutoff wavelength, a GaInAsSb quaternary alloy material which is lattice matched to the GaSb substrate can be used for the absorber layer, and a matching GaAlSbAs quaternary alloy material may be used for the barrier layer. The lattice-matching GaInAsSb may be thought of as being formed by mixing GaSb and an InAsSb ternary alloy (with a typical composition of $InAs_{0.91}Sb_{0.09}$) which is lattice-matched to the GaSb substrate, grown in any manner known in the art. The resulting $(InAs_{0.91}Sb_{0.09})$ z $(GaSb)(1-z)$ quaternary alloy is lattice matched to the GaSb substrate. Changing the absorber mixing ratio z, adjusts band gap of the quaternary alloy absorber layer to yield a cutoff wavelength ranging from approximately 4.5 nm down to the short wavelength infrared (SWIR). See FIG. 4A. Similarly, GaSb and $AlSb_{0.92}As_{0.08}$ may be mixed to form the GaAlSbAs as a $(AlSb_{0.92}As_{0.08})$ y $(GaSb)(1-y)$ quaternary alloy grown as a lattice matched barrier layer in a manner known in the art. By carefully selecting the "y" value for a given GaInAsSb absorber layer having a given "z" value, the matching nBn barrier layer, which has nearly the same valence band edge position as the absorber, may be formed. Applying this technique, a range of HOT-BIRDs can be readily produced having tailorable cutoff wavelengths along a continuous range from approximately 4.5 μm down to the SWIR.

Figure 3B:
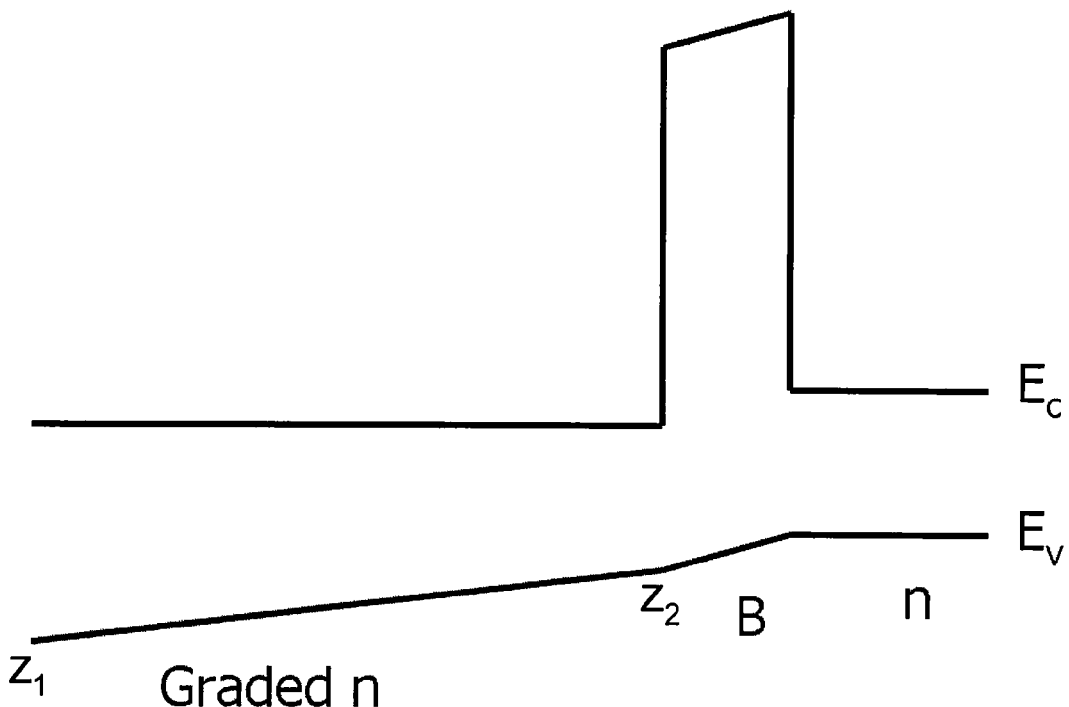
FIG. 3B is a schematic energy band diagram showing conduction and valence band edges for an exemplary barrier infrared detector with a graded gap absorber layer.

The ability to change the band gap of the GaInAsSb continuously along the growth direction by varying the "z" value offers flexibility in device design. A GaInAsSb absorber with varying "z" value along the growth direction may be used in an nBn detector, as illustrated by the transition from $z_1$ to $z_2$ in FIG. 3B. The energy band diagram in FIG. 3B shows an nBn detector with a graded band gap absorber, created by varying the "z" value along the growth direction. The advantage of such a structure is that the graded band gap acts as a quasi electric field which serves to move the holes towards the top contact layer.

Figure 3C:
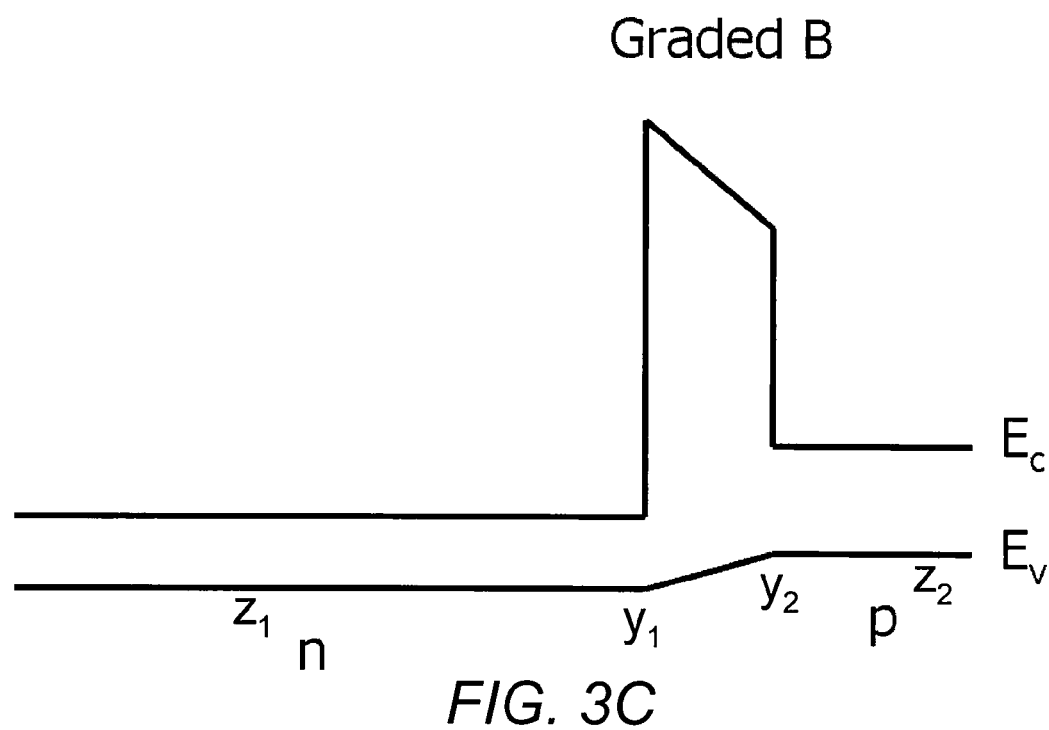
FIG. 3C is a schematic energy band diagram showing conduction and valence band edges for the exemplary barrier infrared detector with the absorber layer and the top contact layer having different band gaps and different doping types, connected by a graded-gap barrier layer.

In one embodiment of the device structure, the absorber and the top contact layer may be made from GaInAsSb alloys with different "z" values. In another embodiment of the device structure, the absorber and the top contact layer may have different doping types. In yet another embodiment, the "y" value of the barrier layer could vary along the growth direction. FIG. 3C illustrates a device structure with all of the above mentioned characteristics. For example, the absorber layer composition may be specified by mixing ratio $z_1$, which is different from the composition of the top contact layer, identified by mixing ratio $z_2$. In addition, the absorber layer may be a doped n-type, while the top contact layer is doped p-type. Further, the barrier layer composition varies along the growth direction from $y_1$ to $y_2$. Note that the varying the "y" value of the barrier layer is performed in a manner to create a smooth transition between the valence band edges of the absorber layer and the top contact layer, as illustrated by the transition from $y_1$ to $y_2$ in FIG. 3C.

Figure 4A:
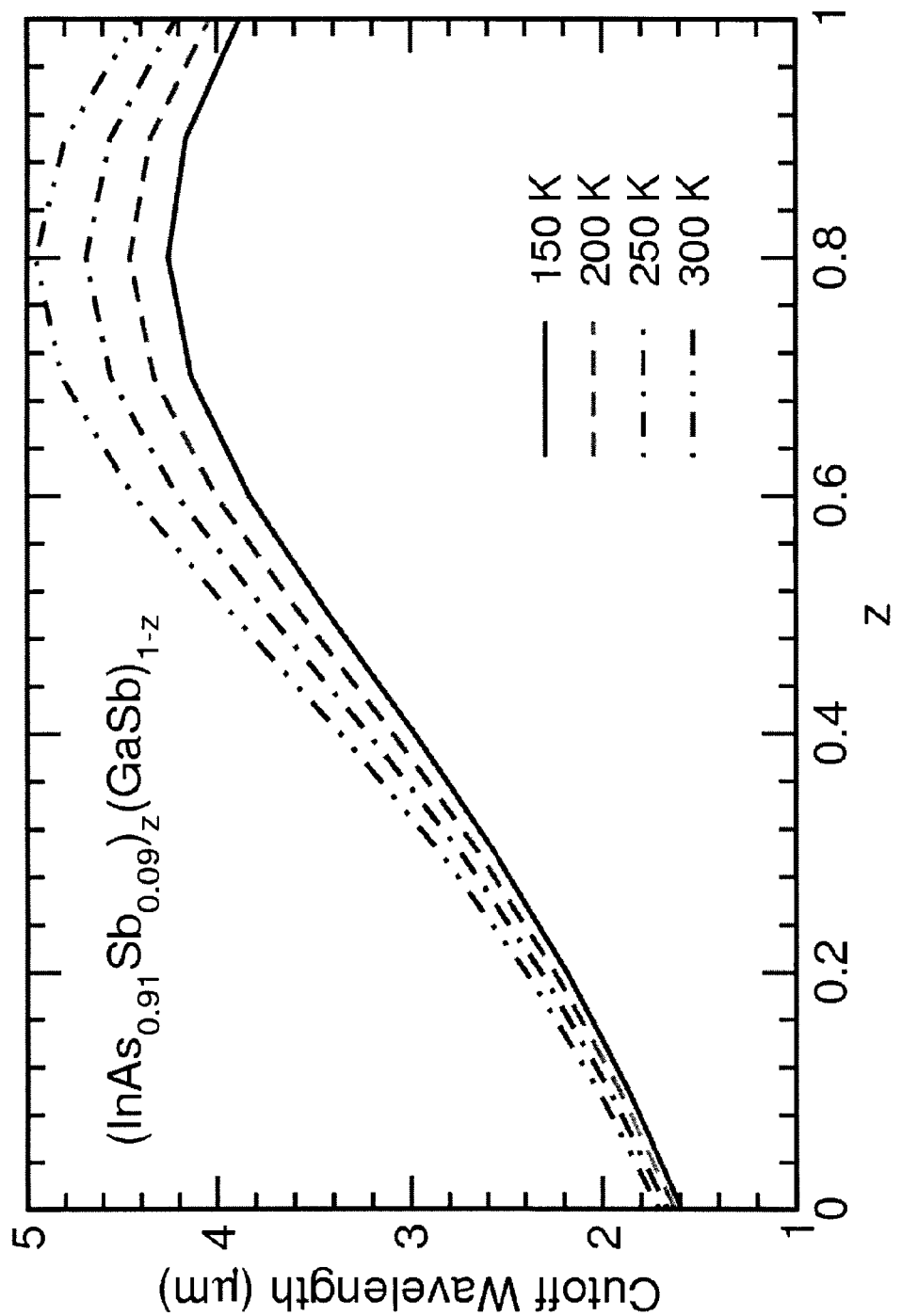
FIG. 4A is graph of calculated cutoff wavelengths at various temperatures of the GaInAsSb absorber layer as a function of the absorber mixing ratio for an exemplary barrier infrared detector embodiment of the invention.

FIG. 4A is graph of calculated cutoff wavelengths at various temperatures of the GaInAsSb absorber layer as a function of the absorber mixing ratio for an exemplary barrier infrared detector embodiment of the invention. The calculated cutoff wavelengths at various temperatures of the GaInAsSb quaternary alloy are shown as a function of the absorber mixing ratio z between InAsSb and GaSb.

Figure 4B:
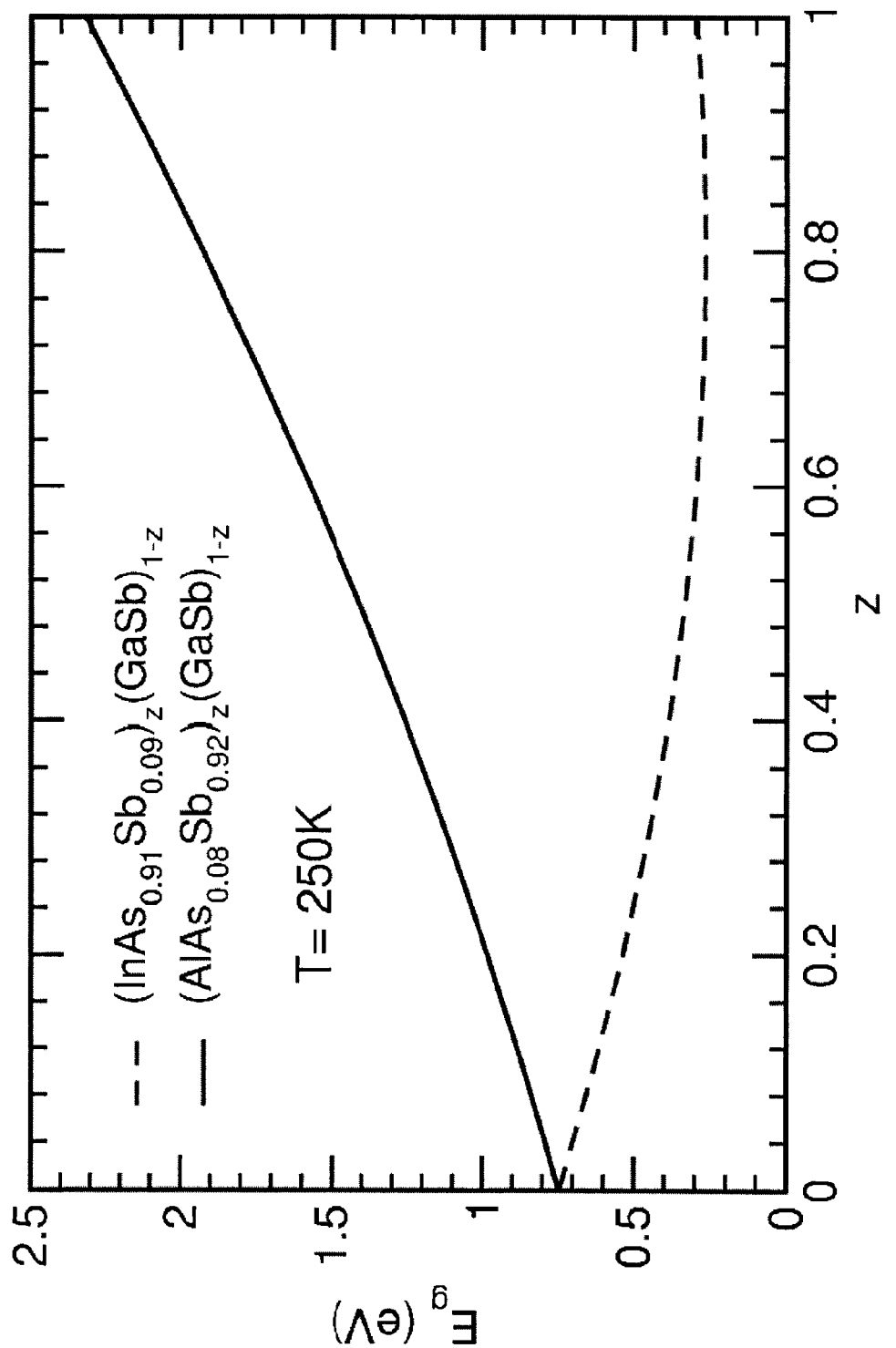
FIG. 4B is graph of energy band gaps of the GaInAsSb absorber layer and the GaAlAsSb barrier layer at 250K for an exemplary barrier infrared detector embodiment of the invention.

FIG. 4B is graph of energy band gaps of the GaInAsSb absorber layer and the GaAlAsSb barrier layer at 250K for an exemplary barrier infrared detector embodiment of the invention. The 250K energy band gaps of the GaInAsSb absorber and the GaAlAsSb barrier quaternary semiconductors are shown, both of which are lattice matched to the GaSb substrate. (Note that the absorber mixing ratio for GaInAsSb and the barrier mixing ratio for GaAlAsSb are both identified as "z" to employ a common axis in the plot. However, the barrier mixing ratio is identified as "y" elsewhere herein.)

4. Tailoring Cutoff Wavelength in a Barrier Infrared Detector

Embodiments of the invention also encompass a method of producing a high operating temperature barrier infrared detector device. As discussed above, the device may be tailored to have a desired cutoff wavelength, e.g. less than or equal 4.2 microns.

Figure 5:
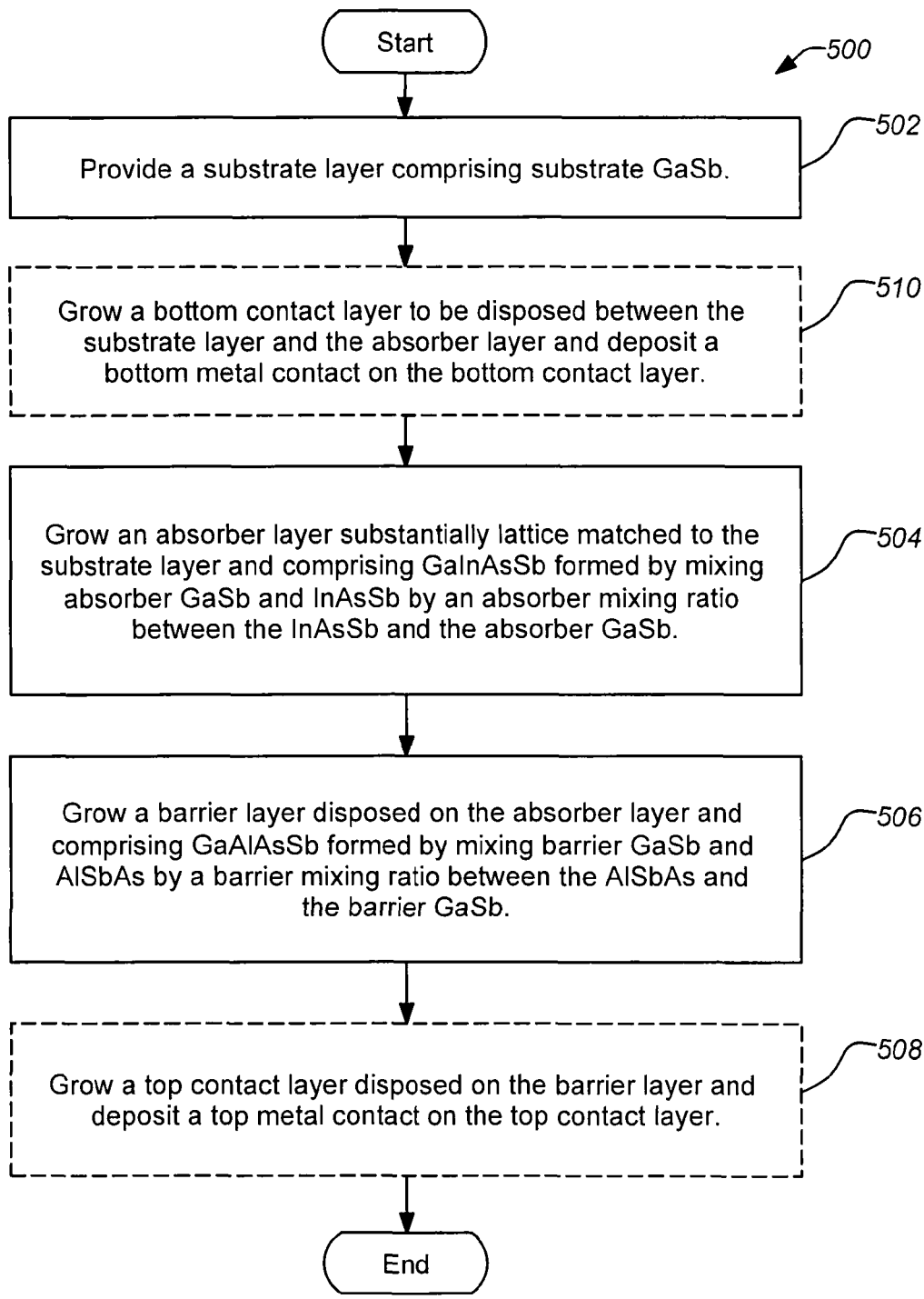
FIG. 5 is a flowchart of an exemplary method of producing a barrier infrared detector.

FIG. 5 is a flowchart of an exemplary method 500 of producing a barrier infrared detector. The method 500 begins with an operation 502 of providing a substrate layer comprising substrate GaSb. Next in operation 504 an absorber layer is grown substantially lattice matched to the substrate layer and comprising GaInAsSb formed by mixing absorber GaSb and InAsSb by an absorber mixing ratio between the InAsSb and the absorber GaSb. As discussed above, the absorber mixing ratio may be selected to adjust a band gap of the absorber layer which determines a cutoff wavelength for the barrier infrared detector device. Following this in operation 506, a barrier layer is grown disposed on the absorber layer and comprising GaAlAsSb formed by mixing barrier GaSb and AlSbAs by a barrier mixing ratio between the AlSbAs and the barrier GaSb. The barrier mixing ratio may be selected such that valence band edges of the barrier layer and the absorber layer match.

The method 500 may be further enhanced through optional operations consistent with the described parameters and any known techniques of semiconductor device manufacture as will be understood by those skilled in the art. For example, an optional operation 508 (indicated by dashed lines around the operation) of growing a top contact layer disposed on the barrier layer and depositing a top metal contact on the top contact layer. In optional operation 510 (performed before growing the absorber layer in operation 504) a bottom contact layer is grown to be disposed between the substrate layer and the absorber layer and a bottom metal contact is deposited on an exposed bottom contact area. In addition, note that the order of operations may be altered consistent with known techniques for semiconductor device manufacture.

This concludes the description including the preferred embodiments of the present invention. The foregoing description including the preferred embodiment of the invention has been presented for the purposes of illustration and description. It is not intended to be exhaustive or to limit the invention to the precise forms disclosed. Many modifications and variations are possible within the scope of the foregoing teachings. Additional variations of the present invention may be devised without departing from the inventive concept as set forth in the following claims.

What is claimed is:

1. A barrier infrared detector, comprising:
    a substrate layer comprising GaSb;
    an entire absorber layer substantially lattice matched to and in direct contact with the substrate layer and comprising a first quaternary alloy of GaInAsSb having an absorber mixing ratio of InAsSb and GaSb of the first quaternary alloy of GaInAsSb; and
    a barrier layer in direct contact with the absorber layer and comprising a second quaternary alloy of GaAlAsSb having a barrier mixing ratio of AlSbAs and GaSb of the second quaternary alloy of GaAlAsSb.

2. The barrier infrared detector of claim 1, wherein the InAsSb mixed into the absorber layer comprises $InAs_{0.91}Sb_{0.09}$ and the AlSbAs mixed into the barrier layer comprises $AlSb_{0.92}As_{0.08}$.

3. The barrier infrared detector of claim 1, wherein the barrier layer is substantially lattice matched to the absorber layer and the substrate layer.

4. The barrier infrared detector of claim 1, wherein the absorber mixing ratio varies along an absorber layer growth direction.

5. The barrier infrared detector of claim 1, wherein the absorber mixing ratio is selected to adjust a band gap of the absorber layer and thereby determines a cutoff wavelength for the barrier infrared detector device.

6. The barrier infrared detector of claim 1, wherein the barrier mixing ratio varies along a barrier layer growth direction.

7. The barrier infrared detector of claim 1, further comprising a bottom metal contact deposited on an exposed absorber area of the absorber layer.

8. The barrier infrared detector of claim 1, further comprising a top contact layer disposed on the barrier layer.

9. The barrier infrared detector of claim 8, wherein the top contact layer comprises GaInAsSb having a top contact mixing ratio of GaSb and InAsSb, the top contact mixing ratio differing from the absorber mixing ratio.

10. The barrier infrared detector of claim 8, wherein the top contact layer is n-doped.

11. The barrier infrared detector of claim 8, wherein the top contact layer comprises doping differing from that of the absorber layer.

12. The barrier infrared detector of claim 8, wherein the top contact layer is isolated into an array of elements.

13. The barrier infrared detector of claim 12, further comprising a separate top metal contact deposited on each element of the array of the top contact layer.

14. The bather infrared detector of claim 1, wherein the barrier mixing ratio is selected such that valence band edges of the barrier layer and the absorber layer match.

15. A barrier infrared detector, comprising:
    a substrate layer comprising GaSb;
    a bottom contact layer in direct contact with the substrate layer;
    an entire absorber layer substantially lattice matched to the substrate layer and in direct contact with the bottom contact layer and comprising a first quaternary alloy of GaInAsSb having an absorber mixing ratio of InAsSb and GaSb of the first quaternary alloy of GaInAsSb; and
    a barrier layer in direct contact with the absorber layer and comprising a second quaternary alloy of GaAlAsSb having a barrier mixing ratio of AlSbAs and GaSb of the second quaternary alloy of GaAlAsSb.

16. The barrier infrared detector of claim 15, wherein the InAsSb mixed into the absorber layer comprises $InAs_{0.91}Sb_{0.09}$ and the AlSbAs mixed into the barrier layer comprises $AlSb_{0.92}As_{0.08}$.

17. The barrier infrared detector of claim 15, wherein the barrier layer is substantially lattice matched to the absorber layer and the substrate layer.

18. The barrier infrared detector of claim 15, wherein the absorber mixing ratio varies along an absorber layer growth direction.

19. The barrier infrared detector of claim 15, wherein the absorber mixing ratio is selected to adjust a band gap of the absorber layer and thereby determines a cutoff wavelength for the barrier infrared detector device.

20. The barrier infrared detector of claim 15, wherein the barrier mixing ratio is selected such that valence band edges of the barrier layer and the absorber layer match.

21. The barrier infrared detector of claim 15, wherein the barrier mixing ratio varies along a barrier layer growth direction.

22. The barrier infrared detector of claim 15, further comprising a bottom metal contact deposited on an exposed area of the bottom contact.

23. The barrier infrared detector of claim 15, further comprising a top contact layer disposed on the barrier layer.

24. The barrier infrared detector of claim 23, wherein the top contact layer comprises GaInAsSb having a top contact mixing ratio of GaSb and InAsSb, the top contact mixing ratio differing from the absorber mixing ratio.

25. The barrier infrared detector of claim 23, wherein the top contact layer is n-doped.

26. The barrier infrared detector of claim 23, wherein the top contact layer comprises doping differing from that of the absorber layer.

27. The barrier infrared detector of claim 23, wherein the top contact layer is isolated into an array of elements.

28. The barrier infrared detector of claim 27, further comprising a separate top metal contact deposited on each element of the array of the top contact layer.

29. A barrier infrared detector, comprising:
    a substrate layer comprising GaSb;
    an entire absorber layer substantially lattice matched to and in direct contact with the substrate layer and comprising a first quaternary alloy of GaInAsSb having an absorber mixing ratio of InAsSb and GaSb of the first quaternary alloy of GaInAsSb; and
    a barrier layer in direct contact with the absorber layer and comprising a second quaternary alloy of GaAlAsSb having a barrier mixing ratio of AlSbAs and GaSb of the second quaternary alloy of GaAlAsSb;
    wherein the barrier layer is substantially lattice matched to the absorber layer and the substrate layer, the absorber mixing ratio varies along an absorber layer growth direction and is selected to adjust a band gap of the absorber layer and thereby determines a cutoff wavelength for the barrier infrared detector device, and the barrier mixing ratio is selected such that valence band edges of the barrier layer and the absorber layer match.

* * * * *